(12) United States Patent
Okazaki et al.

(10) Patent No.: US 6,961,913 B1
(45) Date of Patent: Nov. 1, 2005

(54) IP BASE LSI DESIGNING SYSTEM AND DESIGNING METHOD

(75) Inventors: Kaoru Okazaki, Higashiosaka (JP); Masanobu Mizuno, Takatsuki (JP); Michiaki Muraoka, Tokyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/130,546

(22) PCT Filed: Nov. 8, 2000

(86) PCT No.: PCT/JP00/07869

§ 371 (c)(1), (2), (4) Date: May 20, 2002

(87) PCT Pub. No.: WO01/37148

PCT Pub. Date: May 25, 2001

(30) Foreign Application Priority Data

Nov. 18, 1999 (JP) ................................. 11-327796

(51) Int. Cl.[7] ........................................... G06F 17/50
(52) U.S. Cl. ................................. 716/1; 716/3; 716/4
(58) Field of Search .................................. 716/1, 2–21

(56) References Cited

U.S. PATENT DOCUMENTS

| | | | | |
|---|---|---|---|---|
| 5,754,441 A | * | 5/1998 | Tokunoh et al. ............... 716/11 |
| 5,835,505 A | * | 11/1998 | Nishimichi et al. ......... 714/724 |
| 5,892,678 A | * | 4/1999 | Tokunoh et al. ............... 716/2 |
| 6,049,659 A | * | 4/2000 | Matsumoto et al. ........... 716/1 |
| 6,157,947 A | * | 12/2000 | Watanabe et al. ........... 709/217 |

FOREIGN PATENT DOCUMENTS

| | | |
|---|---|---|
| EP | 584828 A2 | 3/1994 |
| EP | 674285 A2 | 9/1995 |
| JP | 7-129657 A | 5/1995 |
| JP | 7-311797 | 11/1995 |
| JP | 10-507013 | 7/1998 |
| JP | 6-332965 | 12/2001 |
| WO | WO 95/31778 | 11/1995 |

OTHER PUBLICATIONS

"System LSI Sekkei System Open CAD (V5)", Katsuya Furuki et al., NEC Gihou, vol. 50, No. 3, Mar. 1997, pp. 98-102.

"HDL wo mochiita teishouhi denryoku-ka sekkei nyuumon (Part II)," Interface, vol. 23, No. 1, pp. 205-208, Jan. 1997.

* cited by examiner

*Primary Examiner*—A. M. Thompson
*Assistant Examiner*—Magid Y. Dimyan
(74) *Attorney, Agent, or Firm*—McDermott Will & Emery LLP

(57) ABSTRACT

An IP database includes a system level IP used in system level design. IPs A and B in the system level IP are divided into processing algorithm description portions, input data structure definition portions and output data structure definition portions. When a communication channel is provided between the IPs communicating data in architecture or functional design, a conversion circuit generating means generates a data conversion circuit between the communication channel and each of the IPs with reference to the IP database.

15 Claims, 16 Drawing Sheets system level architecture level
functional level

Fig. 3
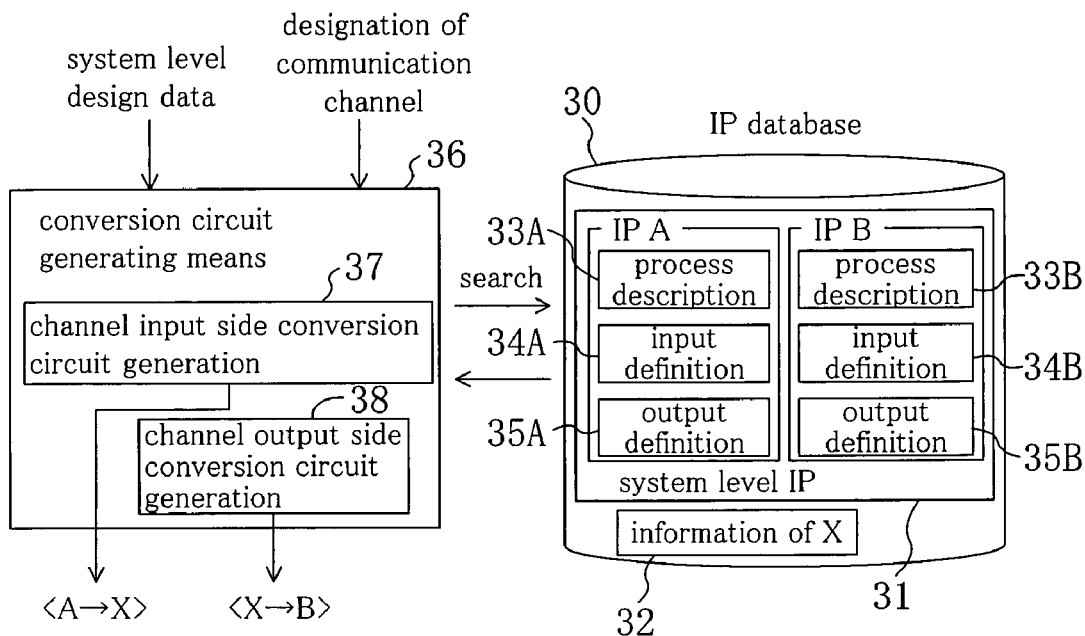
Fig. 4(a) ⟨A→X⟩
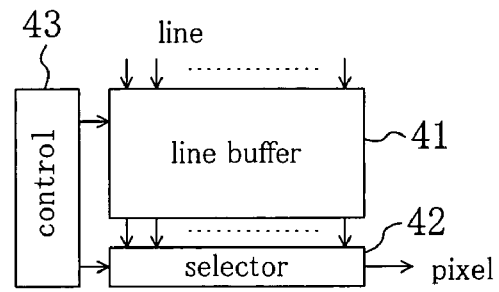
Fig. 4(b) ⟨X→B⟩
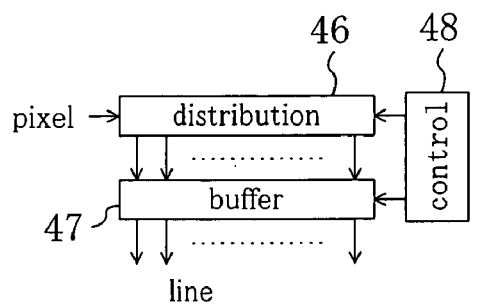

Fig. 5(a)
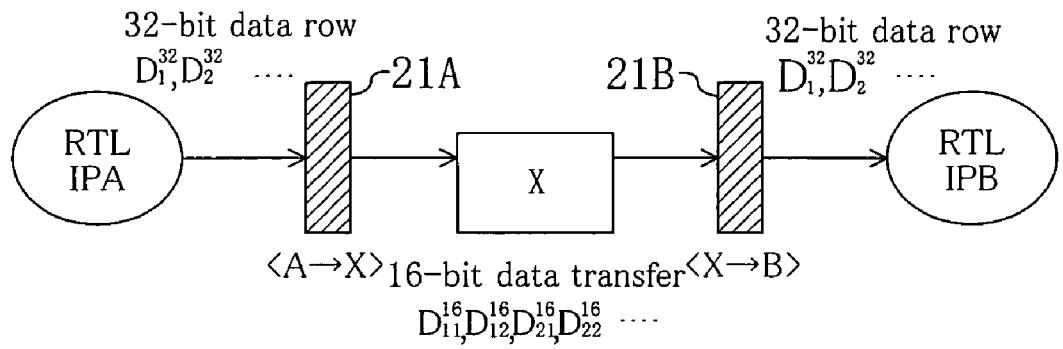
Fig. 5(b) <A→X>
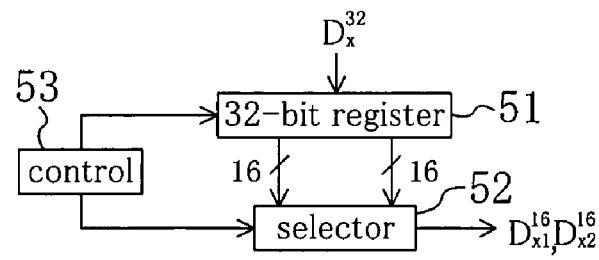
Fig. 5(c) <X→B>
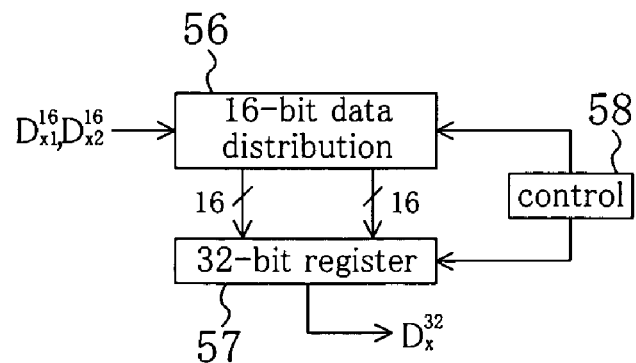

system level architecture level
functional level

Fig. 15

| Combination of IPs | Compatibility |
|---|---|
| (IP-1) and (IP-2) | ・An verification tool that can verify Verliog-xL and VHDL installed together is required. (theoretical) |
| (IP-1) and (IP-3) | ・Verification time is increased. (theoretical)<br>・There are common blocks.<br>・When mounted by 0.18 μm: area: 0.2 mm², speed: 40 MHZ, power: 0.1 W. (empirical) |
| (IP-3) and (IP-4) | ・An interface block between IPs is required. (empirical)<br>・When mounted by 0.25 μm: area: 0.5 mm², speed: 40 MHZ, power: 0.6 W. (empirical) |
| (IP-2) and (IP-3) | ・Verification time is increased. (theoretical) |
| (IP-4) and (IP-6) | ・IP-6 can be installed in IP-4. (empirical)<br>・Performance when installed: speed: 10 MHZ, power: 0.6 W. (empirical) |
| (IP-1) and (IP-5) | ・Same functionality. (theoretical) |
| (IP-2) and (IP-4) and (IP-5) | ・When mounted by 0.18 μm: area: 0.3 mm², speed: 20 MHZ, power: 0.5 W. (empirical) |
| ……… | |

83

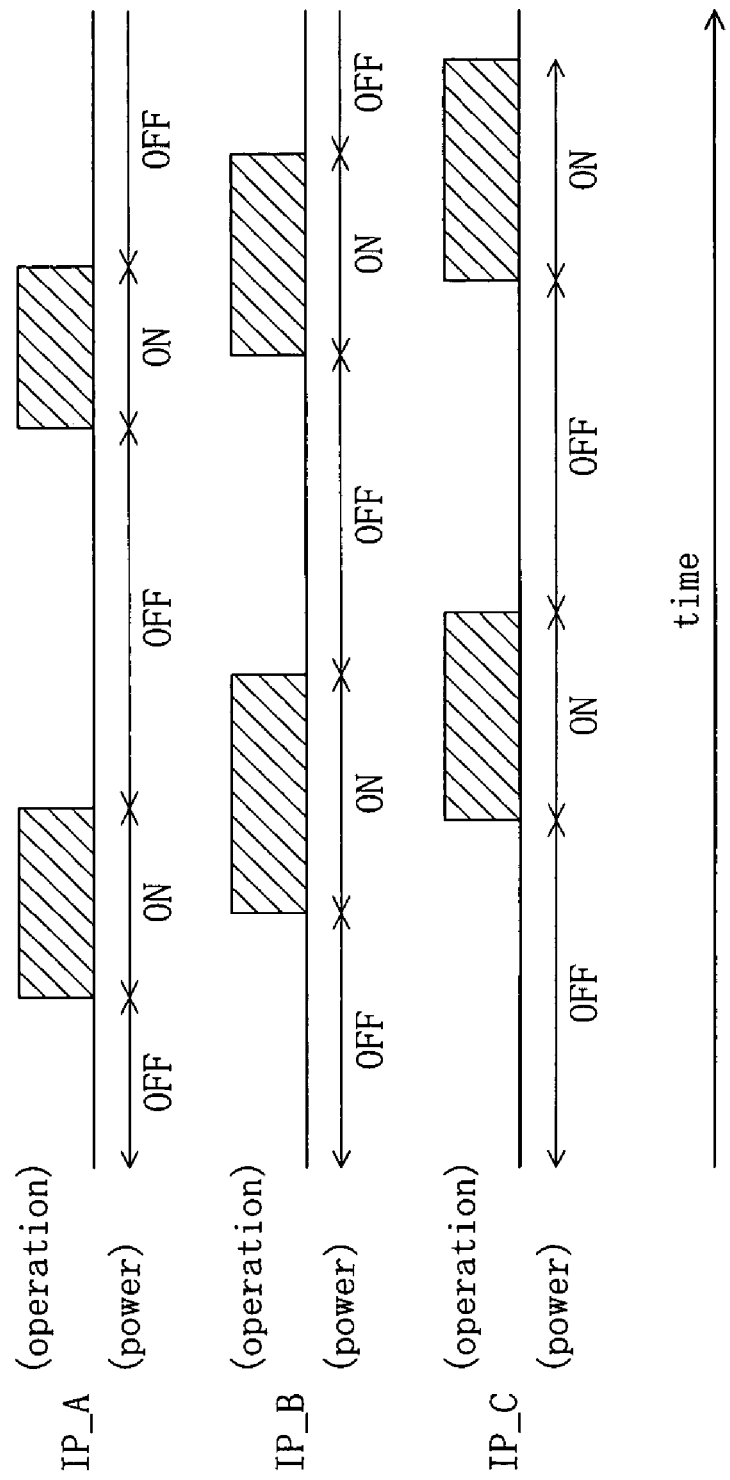

IP BASE LSI DESIGNING SYSTEM AND DESIGNING METHOD

TECHNICAL FIELD

The present invention belongs to a technology relating to a so-called IP-based LSI design.

BACKGROUND ART

Conventionally, integrated circuit devices within electronic appliances have been manufactured by forming individual LSIs of different types, for example, memory and processor, on semiconductor chips and then mounting the chips on a base substrate such as a printed circuit board.

Recently, however, there is a higher demand for miniaturized, lightweight, power-saving and low-cost integrated circuit devices used in electronic appliances, for the purpose of wider-ranging utilization of the electronic appliances. This trend is even more pronounced in the field of digital information household appliances. And in response to this trend, semiconductor manufacturers are forced to shift their emphasis on research and development from memories toward system LSIs.

Specifically, such system LSIs are realized by a so-called system-on-chip solution with the memory and a variety of logic circuits provided on a single chip. For the system-on-chip solution, process technology is required for forming elements having different structures on a common substrate, but also the design technology therefor needs to be revolutionized.

Thus, a so-called IP based method of preparing data (IPs) for designing so-called functional blocks realizing certain functions and using these data to design a desired system LSI as a combination of the respective functional blocks has been proposed as the design technology suitable for this system-on-chip solution. When such IPs, or data that configures or realizes at least one predetermined function, are used in a design method, the respective functional blocks can be constructed with predetermined configurations for realizing their functions in advance, so that the integrated circuit device can be designed just by designing the wiring among the respective functional blocks, and designing the peripheral circuits. With such a design method, design efficiency can be improved significantly.

However, the above-described IP-based LSI design method has the following problems.

When shifting from system level design to architecture design or functional design, a communication channel between the IPs is also given a concrete form. Thus, consideration must be given to data consistency between each of the IPs and the communication channel, which increases design man-hours. Moreover, when an IP that realizes a certain function is selected, it is very rare that the selected IP can be used for an LSI to be newly designed as it is, and considerable design man-hours are necessary for new designs, revisions and verifications. Furthermore, a power control circuit exclusively used for the LSI needs to be designed manually, so that design efficiency is low.

DISCLOSURE OF INVENTION

It is an object of the present invention to reduce design man-hours and improve design efficiency in IP-based LSI design.

Specifically, as an IP-based LSI design system, the present invention includes an IP database having a system level IP used in system level design, and in the system level IP, each IP is described divided into a processing algorithm description portion describing a processing algorithm of the IP, an input data structure definition portion representing a structure definition of input data serving as a processing unit, and an output data structure definition portion representing a structure definition of output data serving as a processing unit.

It is preferable that the IP-based LSI design system further includes a means for generating a conversion circuit that converts data for communication between a communication channel and the system level IPs, when the communication channel is provided between the system level IPs performing data communication in architecture design or function design.

Furthermore, when the communication channel is provided between first and second system level IPs communicating with each other, the conversion circuit generating means preferably searches the IP database, reads out descriptions of the output data structure definition portion in the first system level IP and the input data structure definition portion in the second system level IP, and generates the conversion circuit based on the read out descriptions. Then, it is preferable that the IP database further includes an IP for the communication channel and that, when the communication channel is provided between the first and the second system level IPs, the conversion circuit generating means searches the IP database and further reads out input/output data structure definitions of the IP for the communication channel. Alternatively, when input/output data structures are different between the first and the second system level IPs, the conversion circuit generating means preferably generates the conversion circuit in accordance with information representing a correspondence between the input/output data structures.

Moreover, it is preferable that the conversion circuit converts the amount of data per communication unit. Alternatively, it is preferable that the conversion circuit preferably a conversion between address data indicating a data area and actual data corresponding to the address data.

Furthermore, as an IP-based LSI design method the present invention uses an IP database having a system level IP used in system level design, and in the system level IP, each IP is described divided into a processing algorithm description portion describing a processing algorithm of the IP, an input data structure definition portion representing a structure definition of input data serving as a processing unit, and an output data structure definition portion representing a structure definition of output data serving as a processing unit.

It is preferable that the IP-based LSI design method includes a step of generating a conversion circuit that converts data for communication between a communication channel and the system level IPs, when the communication channel is provided between the system level IPs performing data communication in architecture design or function design.

Furthermore, when the communication channel is provided between a first and a second system level IPs, it is preferable that in the conversion circuit generation step, the IP database is searched, descriptions of the output data structure definition portion in the first system level IP and the input data structure definition portion in the second system level IP are read out and the conversion circuit is generated based on the read out descriptions.

It is preferable that the IP database further includes an IP for the communication channel and that when the communication channel is provided between the first and the second system level IPs, in the conversion circuit generation step, the IP database is searched, and input/output data structure definitions of the IP for the communication channel are further read out. Alternatively, when input/output data structures are different between the first and the second system level IPs, it is preferable that in the conversion circuit generation step, the conversion circuit is generated in accordance with information representing a correspondence between the input/output data structures.

Moreover, it is preferable that the conversion circuit converts the amount of data per communication unit. Alternatively, it is preferable that the conversion circuit performs a conversion between address data indicating a data area and actual data corresponding to this address data.

Moreover, as an IP-based LSI design system, the present invention includes a function classification database in which an equipment configuration is classified into respective elements with regard to function and arranged systematically, and IP-based LSI design is carried out using the function classification database.

It is preferable that the IP-based LSI design system includes an existing design asset database in which IPs already generated are stored in association with respective elements in the function classification database, and that an IP suitable for an LSI to be designed is selected from the IPs stored in the existing design asset database with reference to the function classification database.

Furthermore, it is preferable that the IP-based LSI design system includes a design assets compatibility evaluation rule database that stores information for defining mutual compatibility between the IPs stored in the existing design asset database, and that compatibility of the IP selected for the LSI to be designed is evaluated with reference to the design assets compatibility evaluation rule database. Alternatively, it is preferable that the IP-based LSI design system selects an IP having a similar function to that of an IP suitable for the LSI to be designed from the IPs stored in the existing design asset database and revises the function of the selected IP so as that it becomes suitable for the LSI to be designed. Alternatively, it is preferable that the existing design asset database in the IP-based LSI design system includes a means for managing history information, such as a progenitor IP and differences from the progenitor IP, for each of the IPs to be stored.

Moreover, as an IP-based LSI design method, the present invention uses a function classification database in which an equipment configuration is classified into elements with regard to function and arranged systematically to perform IP-based LSI design.

It is preferable that the IP-based LSI design method uses an existing design asset database in which IPs already generated are stored in association with respective elements in the function classification database and that an IP suitable for an LSI to be designed is selected from the IPs stored in the existing design asset database with reference to the function classification database.

Furthermore, it is preferable that the IP-based LSI design method uses a design assets compatibility evaluation rule database that stores information for defining mutual compatibility between the IPs stored in the existing design asset database and that compatibility of the IP selected for the LSI to be designed is evaluated with reference to the design assets compatibility evaluation rule database. Alternatively, it is preferable that the IP-based LSI design method selects an IP having a similar function to that of an IP suitable for the LSI to be designed from the IPs stored in the existing design asset database and revises the function of the selected IP so that it becomes suitable for the LSI to be designed.

Moreover, as an IP-based LSI design system, the present invention includes a means for generating architecture level design data from a system level function definition regarding an LSI to be designed, a means for performing operation analysis of the LSI to be designed by using the generated architecture level design data and an operation pattern definition of the LSI to be designed, and a means for generating a power control block in the architecture level design data based on operation analysis results.

Furthermore, as an IP-based LSI design method, the present invention includes a step of generating architecture level design data from a system level function definition, a step of performing an operation analysis of the LSI to be designed by using the generated architecture level design data and an operation pattern definition of the LSI to be designed, and a step of generating a power control block in the architecture level design data based on operation analysis results.

BRIEF DESCRIPTION OF DRAWINGS

FIG. 3 is a diagram showing an example of a configuration for a main part of an IP-based LSI design system according to the first embodiment of the present invention.

FIGS. 4(a) and 4(b) are diagrams showing an example of a generated data conversion circuit.

FIGS. 5(a), 5(b) and 5(c) are diagrams showing another example of the data conversion circuit.

FIG. 15 is a diagram showing an example of the contents of a design assets compatibility evaluation rule DB.

FIG. 17 is a diagram showing an example of operation analysis results.

BEST MODE FOR CARRYING OUT THE INVENTION

Hereinafter, embodiments of the present invention will be described with reference to the drawings.

First Embodiment

Figure 1:
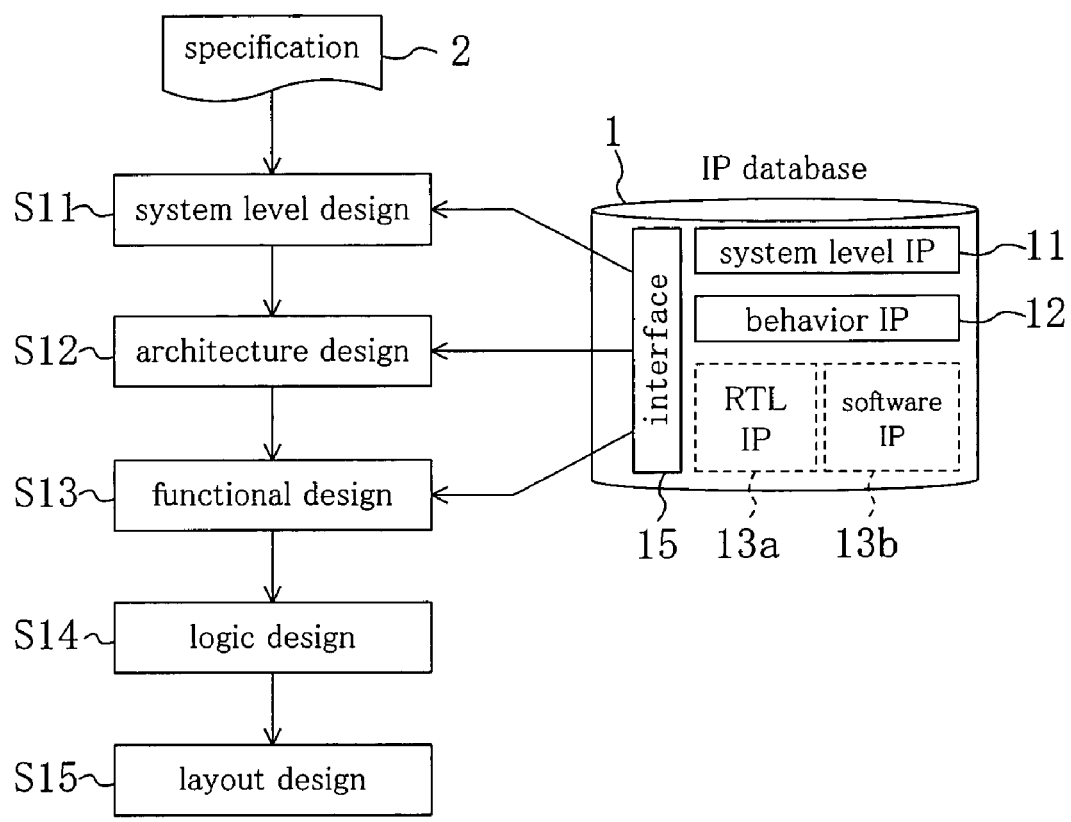
FIG. 1 is a conceptual diagram illustrating IP-based LSI design.

FIG. 1 is a conceptual diagram illustrating IP-based LSI design. As shown in FIG. 1, IP-based LSI design is carried out hierarchically in the order of system level design S11, architecture design S12, functional design S13, logic design S14 and layout design S15. In the system level design S11, the architecture design S12 and the functional design S13, which are the upstream processes, an IP database 1 is utilized, which stores so-called IPs used for the LSI design.

The IP database 1 stores system level IPs 11 having information of the system level, behavior IPs 12 having information of the architecture level and RTL IPs 13a or software IPs 13b having information of the functional level, each of which is associated with a corresponding IP. In the system level design S11, the system level IP 11 is reused. In the architecture design S12, the behavior IP 12 corresponding to the reused system level IP 11 is retrieved via an interface 15, whereas in the functional design S13, the RTP IP 13a or the software IP 13b corresponding to the reused system level IP 11 is retrieved via the interface 15.

Figure 2A:
FIGS. 2(a) and 2(b) are diagrams schematically showing a conversion from a system level to an architecture level or to a functional level.
Figure 2B:
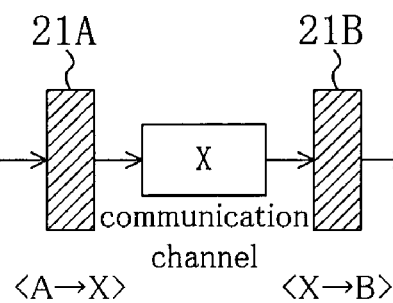

FIGS. 2(a) and 2(b) are diagrams schematically showing a conversion from the system level to the architecture level or to the functional level. In the system level design, a system level IP A and IP B is reused, as shown in FIG. 2(a). In the architecture design or the functional design, lower-level IPs (an RTL IP A and IP B in this figure) corresponding to the system level IP A and IP B are retrieved from the IP database and reused as shown in FIG. 2(b).

However, since a communication channel (for example a bus) X is given a concrete form in the architecture design or the functional design, data conversion circuits 21A and 21B for properly connecting the input/output of the RTL IP A and IP B to the communication channel X have to be newly developed. In order to develop the data conversion circuits 21A and 21B, it is necessary to analyze the input/output of the system level IP A and IP B and verify the consistency of the input/output data. In other words, it is necessary not only to simply realize a processing algorithm but also to take "the consistency of the input/output data" into account.

As described above, although the RTL IP and the software IP can be retrieved easily by referring to the IP database, generation of the data conversion circuit requires design man-hours, and therefore, there is the problem that design efficiency cannot be improved. The invention according to this embodiment solves this problem and realizes a highly efficient IP-based LSI design.

FIG. 3 is a diagram showing an example of a configuration for a main part of the IP-based LSI design system according to this embodiment. A system level IP 31 in an IP database 30 shown in FIG. 3, the IP A and the IP B are described divided into a processing algorithm description portions 33A and 33B describing the processing algorithms of the respective IPs, input data structure definition portions 34A and 34B representing structure definitions of input data serving as processing units and output data structure definition portions 35A and 35B representing structure definitions of output data serving as processing units. An IP 32 representing information of the communication channel X is also stored in the IP database 30. The IP 32 includes descriptions of definitions of input/output data structures of the communication channel X.

Taking an IP that performs YC separation as an example, the processing algorithm description portion, the input data structure definition portion and the output data structure definition portion store the following information, respectively. First, in the processing algorithm description portion, an algorithm of a process for separating an NTSC signal line by line into a luminance signal and a chrominance signal is described. Then, in the input data structure definition portion, a definition of a line of the NTSC signal to be inputted is described as, for example, "in [8] [525]." In the output data structure definition portion, definitions of the luminance signal and the chrominance signal to be outputted are described as, for example, "out 1 [4] [525], out 2 [4] [525]."

In accordance with the design data of the system level or the designation of a communication channel, a conversion circuit generating means 36 generates a data conversion circuit. At this time, the input data structure definition portions 34A and 34B and the output data structure definition portions 35A and 35B of the system level IP 31 in the IP database 30 as well as the communication channel IP 32 are searched.

FIGS. 4(a) and 4(b) are diagrams showing an example of the data conversion circuit generated by the conversion circuit generating means 36. Of these figures, FIG. 4(a) shows an example of the data conversion circuit 21A in the FIG. 2(a), and FIG. 4(b) shows an example of the data conversion circuit 21B. Herein, both of the RTL IP A and the IP B are IPs relating to image processing and are taken to input/output data line by line, whereas the communication channel X is taken to transfer data pixel by pixel.

When a channel input side conversion circuit generating portion 37 generates the data conversion circuit 21A between the RTL IP A and the communication channel X, for example, it searches the output data structure definition portion 35A in the system level IP A and information on the input data structure of the IP 32 for the communication channel X. Then, in accordance with the retrieved information, the size of a line buffer 41 is determined, an output selector 42 is generated and a control circuit 43 is generated as shown in FIG. 4(a). In the same manner, when a channel output side conversion circuit generating portion 38 generates the data conversion circuit 21B between the communication channel X and the RTL IP B, it searches information on the output data structure of the IP 32 for the communication channel X and the input data structure definition portion 34B in the system level IP B. Then, in accordance with the retrieved information, a distribution circuit 46 is generated, the size of a buffer 47 is determined and a control circuit 48 is generated as shown in FIG. 4(b).

FIGS. 5(a) to 5(c) are diagrams showing another example of the data conversion circuit. In FIGS. 5(a) to 5(c), it is assumed that the data word length per communication unit is converted. In FIG. 5(a), both of the RTL IP A and the IP B are taken to input/output data in 32-bit units and the communication channel X is taken to transfer data in 16-bit units. In this case, the data conversion circuit 21A, which is provided with a 32-bit register 51, a selector 52 and a control circuit 53 as shown in FIG. 5(b), is generated between the RTL IP A and the communication channel X, whereas the data conversion circuit 21B, which is provided with a 16-bit data distribution circuit 56, a 32-bit register 57 and a control circuit 58 as shown in FIG. 5(c), is generated between the communication channel X and the RTL IP B.

Figure 6:
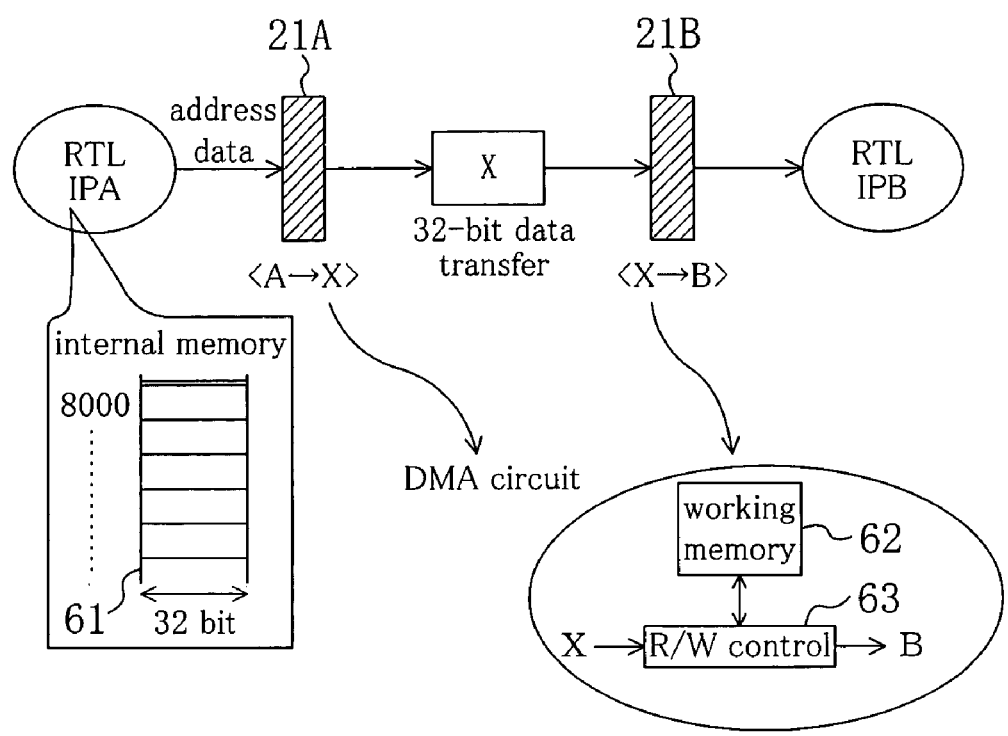
FIG. 6 is a diagram showing another example of the data conversion circuit.

FIG. 6 is a diagram showing another example of the data conversion circuit. In FIG. 6, the RTL IP A has an internal memory 61 with a data length of 32 bit and is taken to output address data designating a location at which output data are stored in this internal memory 61, and the communication channel X is taken to be able to transfer 32-bit data. In other words, FIG. 6 assumes conversion between the address data for designating the location at which the data are stored and the actual data. In this case, a data conversion circuit 21A made of a DMA (Direct Memory Access) circuit is generated between the RTL IP A and the communication channel X, whereas a data conversion circuit 21B, which is provided with a working memory 62 and an R/W control circuit 63, is generated between the communication channel X and the RTL IP B.

For example, if the RTL IP A outputs "8000" as the address data, then the data conversion circuit 21A, which is a DMA circuit, reads out data from the internal memory 61 successively in order from the address 8000. On the other hand, in the data conversion circuit 21B, the R/W control circuit 63 writes a series of data to be transmitted successively from the communication channel X into the working memory 62 and outputs the address data indicating the location into which the data are written to the RTL IP B. Then, the RTL IP B accesses the working memory 62 to obtain the data.

Figure 7:
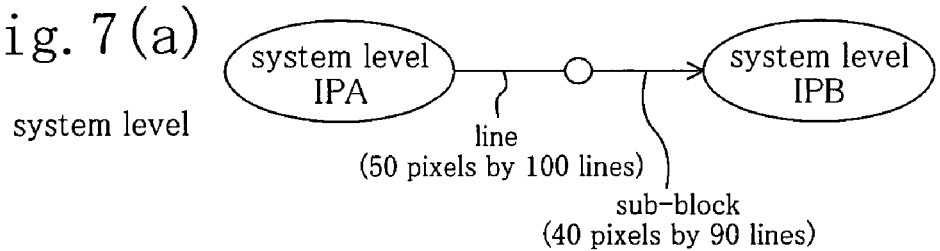
FIGS. 7(a) and 7(b) are diagrams schematically showing the conversion from the system level to the architecture level or to the functional level, in which conversion into a different data structure is made between IPs.
Figure 7:
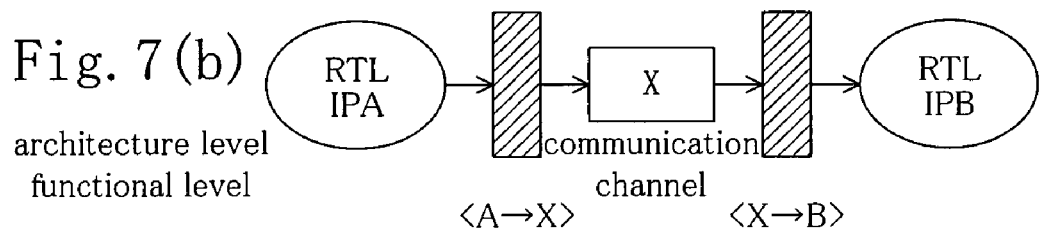

FIGS. 7(*a*) and 7(*b*) are diagrams schematically showing the conversion from the system level to the architecture level or to the functional level, in which conversion into different data structures is carried out between the IPs. In FIG. 7(*a*), output data of the system level IP A are taken to be in line units (50 pixels by 100 lines), whereas input data of the system level IP B are taken to be in sub-block units (40 pixels by 90 lines).

Figure 8:
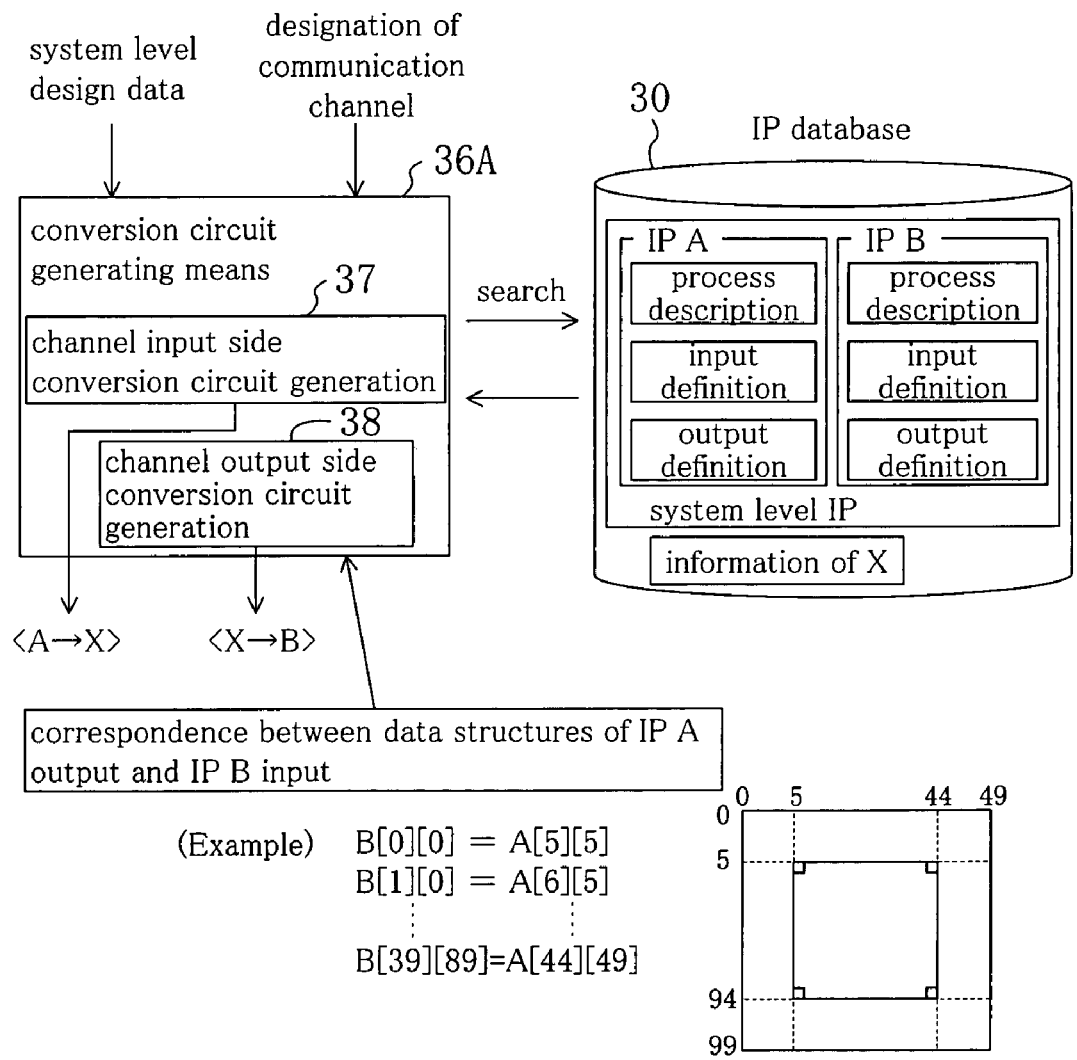
FIG. 8 is a diagram showing an example of a configuration for the main part of the IP-based LSI design system according to the first embodiment of the present invention.

FIG. 8 is a diagram showing an example of a configuration for the main part of the IP-based LSI design system according to this embodiment, and corresponds to FIGS. 7(*a*) and 7(*b*). In addition to the design data of the system level and the designation of the communication channel, a conversion circuit generating means 36A shown in FIG. 8 generates a data conversion circuit in accordance with information that indicates the correspondence between the data structures of the IP A output and the IP B input.

Figure 9:
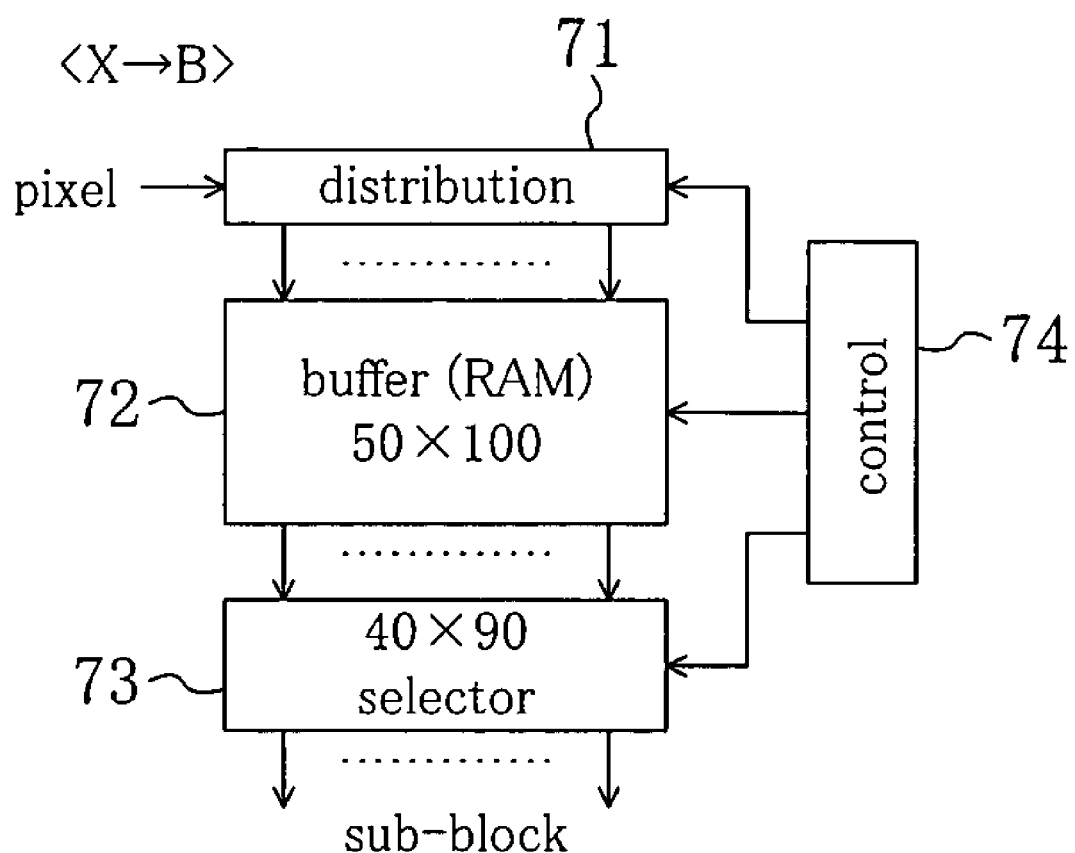
FIG. 9 is a diagram showing an example of the generated data conversion circuit.

FIG. 9 is a diagram showing an example of the data conversion circuit generated by the conversion circuit generating means 36A. A channel output side conversion circuit generating portion 38 searches the information on the output data structure of the IP 32 for the communication channel X and the input data structure definition portion 34B in the system level IP B, and then generates a distribution circuit 71, determines the size of a buffer 72, generates a selector 73 and generates a control circuit 74 in accordance with the retrieved information, as shown in FIG. 9.

Second Embodiment

When an applicable IP is selected by searching the IP database in IP-based LSI design, it is very rare that the selected IP can be used as is for the LSI to be newly designed. Actually, it seems that, in most cases, the selected IP is inappropriate because of specification problems, or even when it is applicable, revisions and verifications are required. This problem increases the design man-hours and hinders realization of the efficient LSI design.

With a so-called target-driven reuse and design method of allocating components in accordance with requirement specifications, this problems is inevitable. Therefore, the inventors of the present invention propose a so-called IP-DB-driven reuse and design method. This method classifies input data into structural elements for which the possibility is high that there are existing design assets (IPs), so that the existing IPs can be used efficiently.

Figure 10:
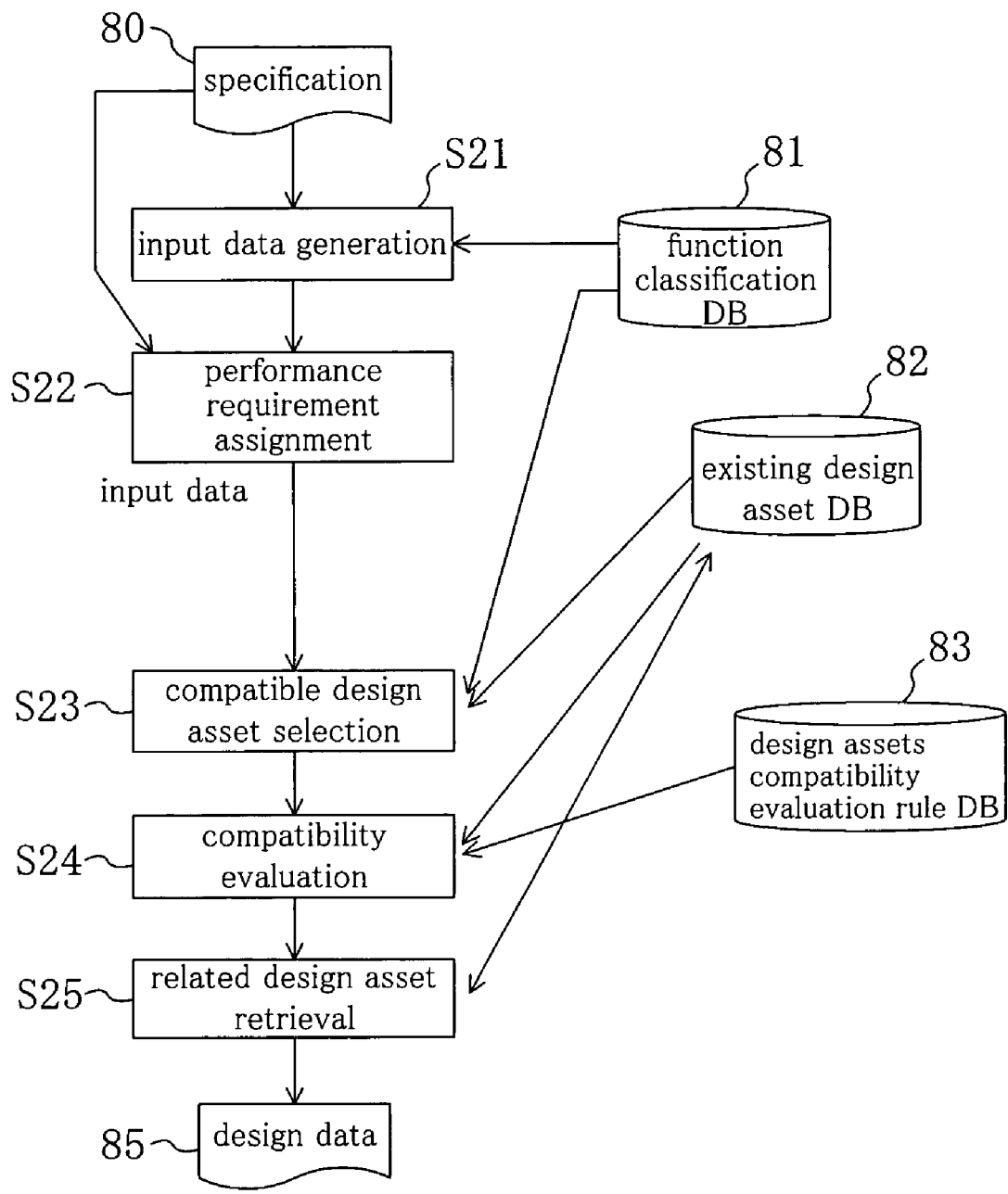
FIG. 10 is a diagram showing a configuration of an IP-based LSI design system according to the second embodiment of the present invention.

FIG. 10 is a diagram showing a configuration of an IP-based LSI design system according to the second embodiment of the present invention. In this system, the steps S21 to S25 are realized by a program that is executed by a computer, for example.

First, in the input data generation step S21, input data are generated hierarchically with reference to a function classification DB 81. Then, in the performance requirement assignment step S22, performance specifications are assigned to the various hierarchical elements of the input data.

Figure 11:
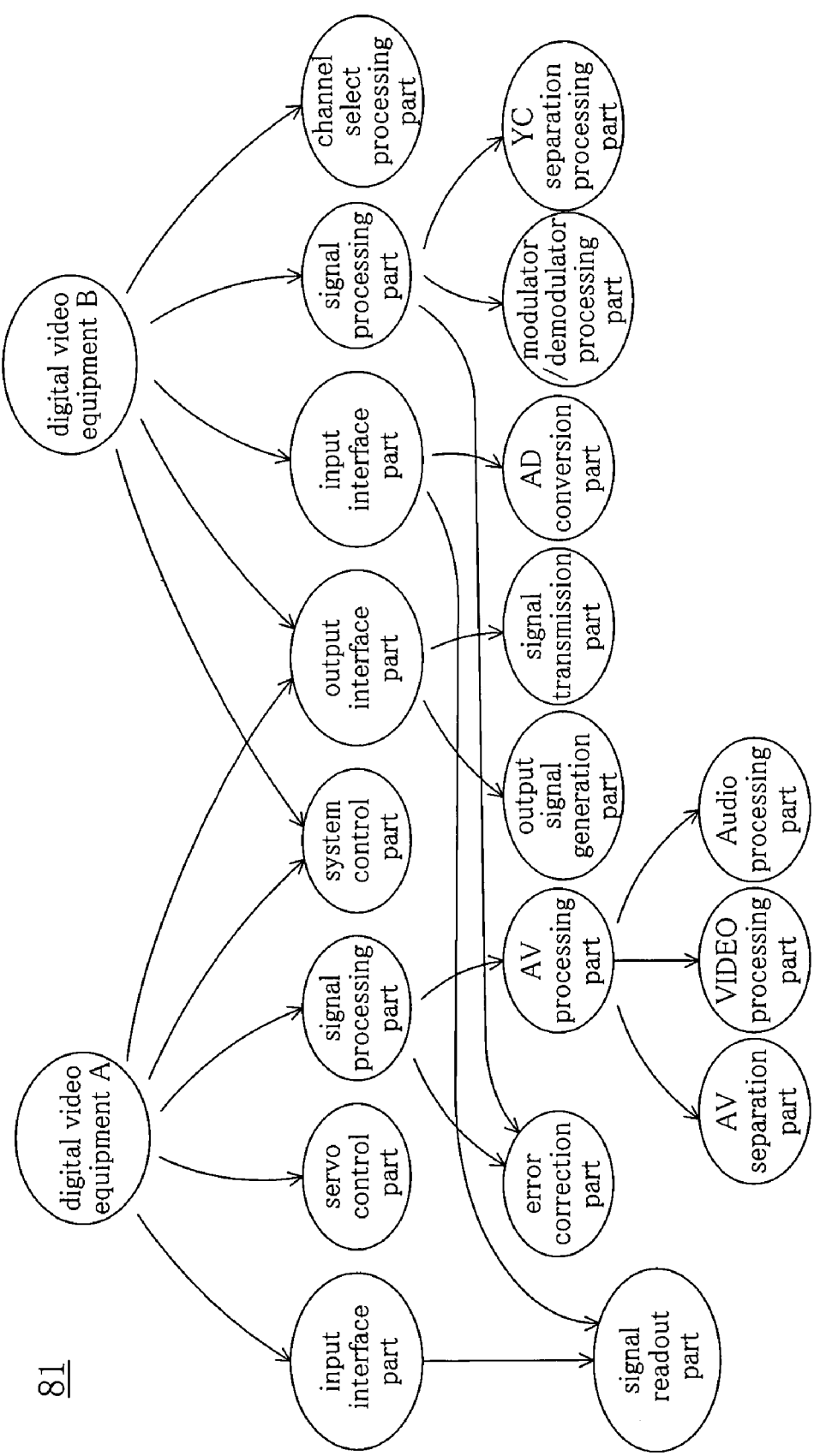
FIG. 11 is a diagram showing an example of the contents of a function classification DB.

FIG. 11 is a diagram showing an example of the contents of the function classification DB 81. In the function classification DB 81, equipment configurations are classified into a variety of elements with regard to their function and then arranged systematically, as shown in FIG. 11. In the example shown in FIG. 11, function classification is carried out for two types of digital video equipment. For example, the digital video equipment A is classified into an input interface part, a servo control part, a signal processing part, a system control part and an output interface part. The input interface part is further classified into a signal readout part, the signal processing part is further classified into an error correction part and an AV processing part, and the output interface part is further classified into an output signal generation part and a signal transmission part. The AV processing part is further classified into an AV separation part, a video processing part and an audio processing part.

Figure 12:
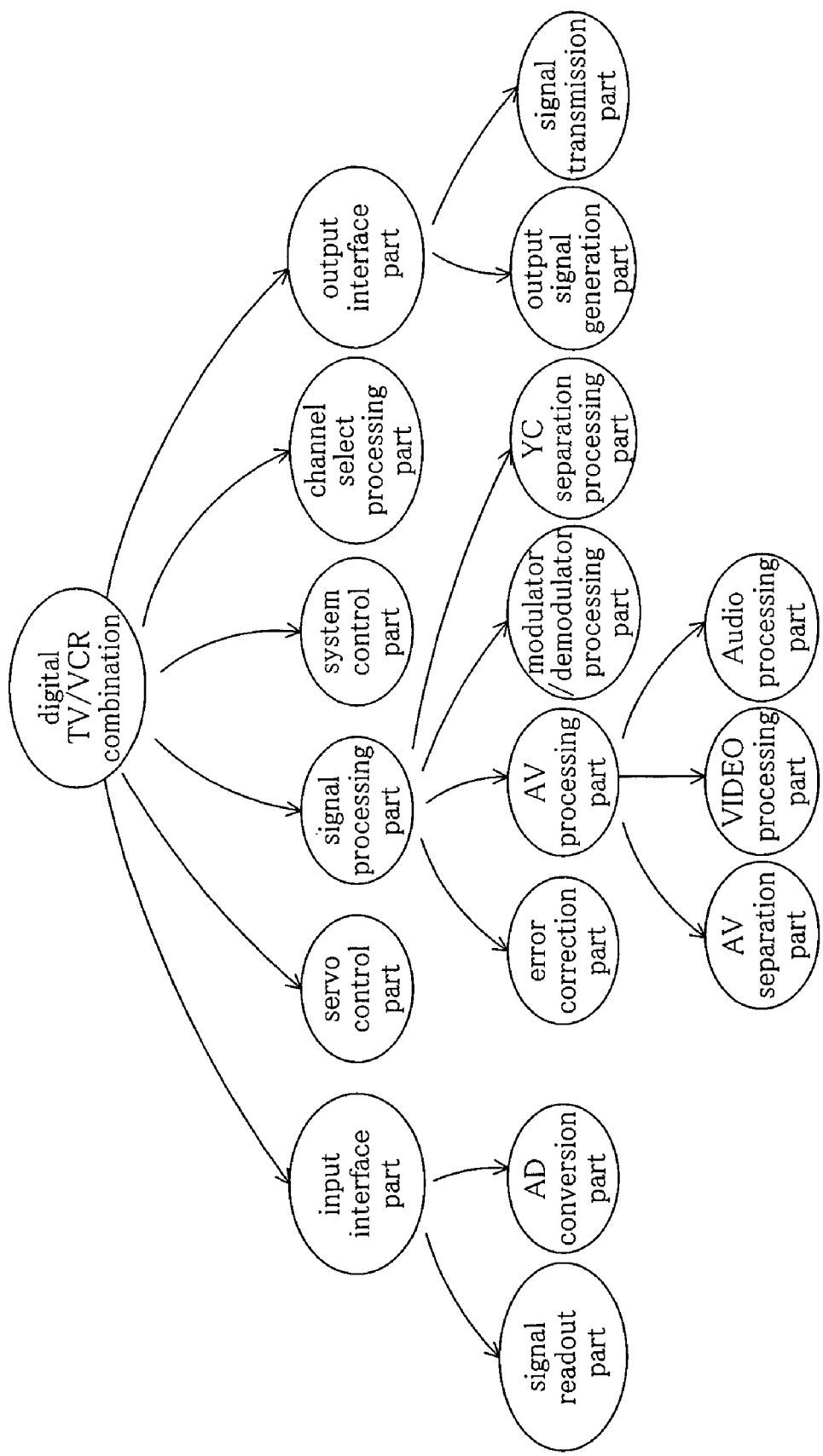
FIG. 12 is a diagram showing an example of input data obtained by referring to the function classification DB.

FIG. 12 is a diagram showing an example of input data obtained through the input data generation step S21 and the performance requirement assignment step S22. In the example shown in FIG. 12, a digital TV/VCR combination is assumed as the object to be newly designed and is provided with digital television functions to which digital video functions are added as its specification 80. As shown in FIG. 12, in the input data generation step S21, a new function hierarchy is constructed as input data, based on the function classification in the function classification DB 81 as shown in FIG. 11.

In the compatible design asset selection step S23, an IP suitable for an LSI to be designed is selected from IPs stored in an existing design asset DB 82 with reference to the function classification DB 81.

Figure 13:
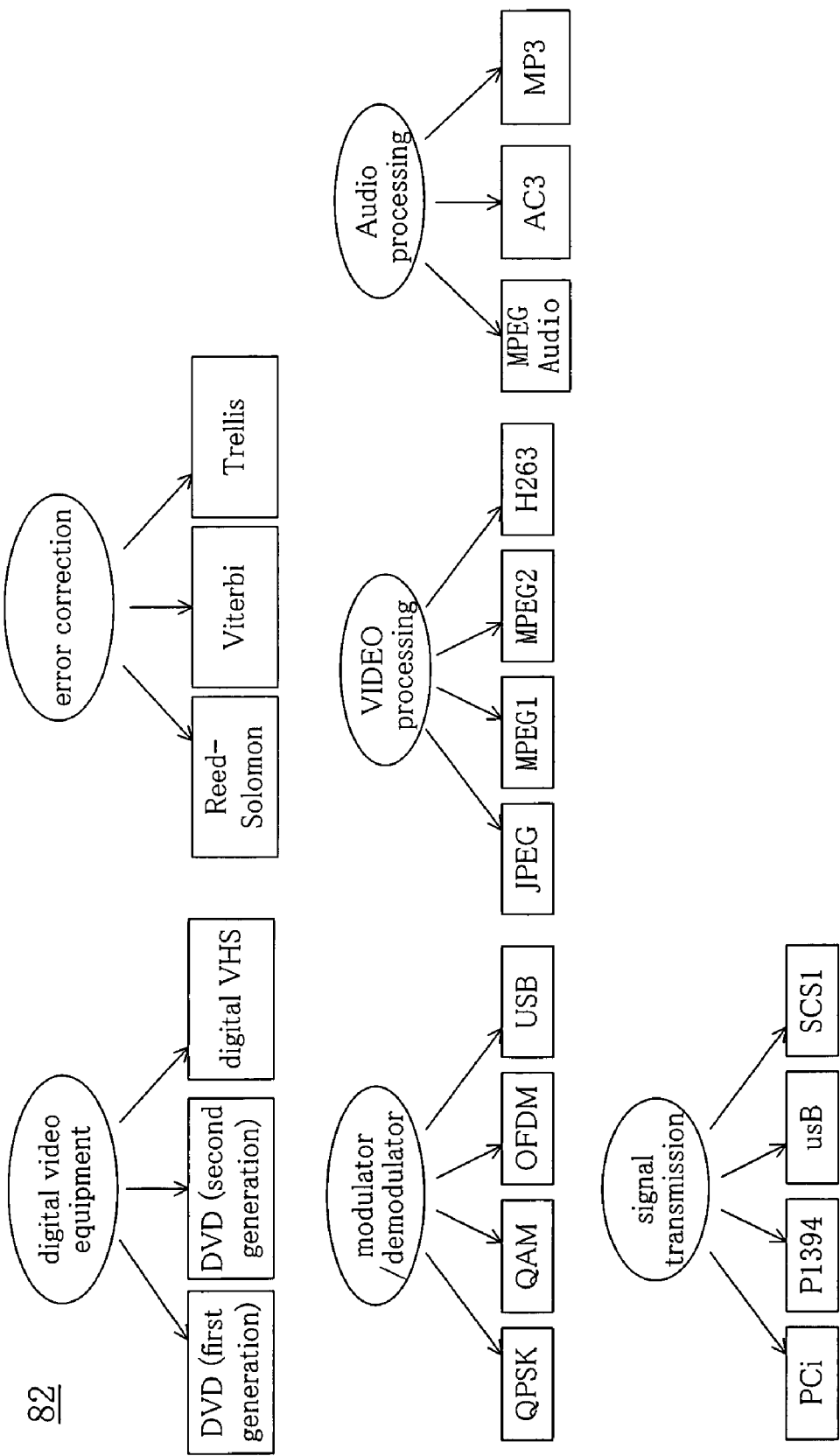
FIG. 13 is a diagram showing an example of the contents of an existing design assets DB.

FIG. 13 is a diagram showing an example of the contents of the existing design asset DB 82. As shown in FIG. 13, in the existing design asset DB 82, IPs that have already been generated are stored in correlation with respective elements in the function classification DB 81. In FIG. 13, blocks surrounded by squares show respective IPs whereas blocks circled by ellipses correspond to elements in the function classification DB 81. For example, three types of IPs, "Reed-Solomon," "Viterbi" and "Trellis," are generated with respect to a function of "error correction."

In this case, input data are described hierarchically as shown in FIG. 12, so that an IP may be selected from any hierarchy. In other words, there may be multiple choices regarding selection of the IP.

Then, in the compatibility evaluation step S24, compatibility of the selected IPs is evaluated with reference to the existing design asset DB 82 and the inter design assets compatibility evaluation rule DB 83. That is to say, an optimal solution for the selection of the IP is obtained in view of cost, power consumption, operating speed and the like.

Figure 14:
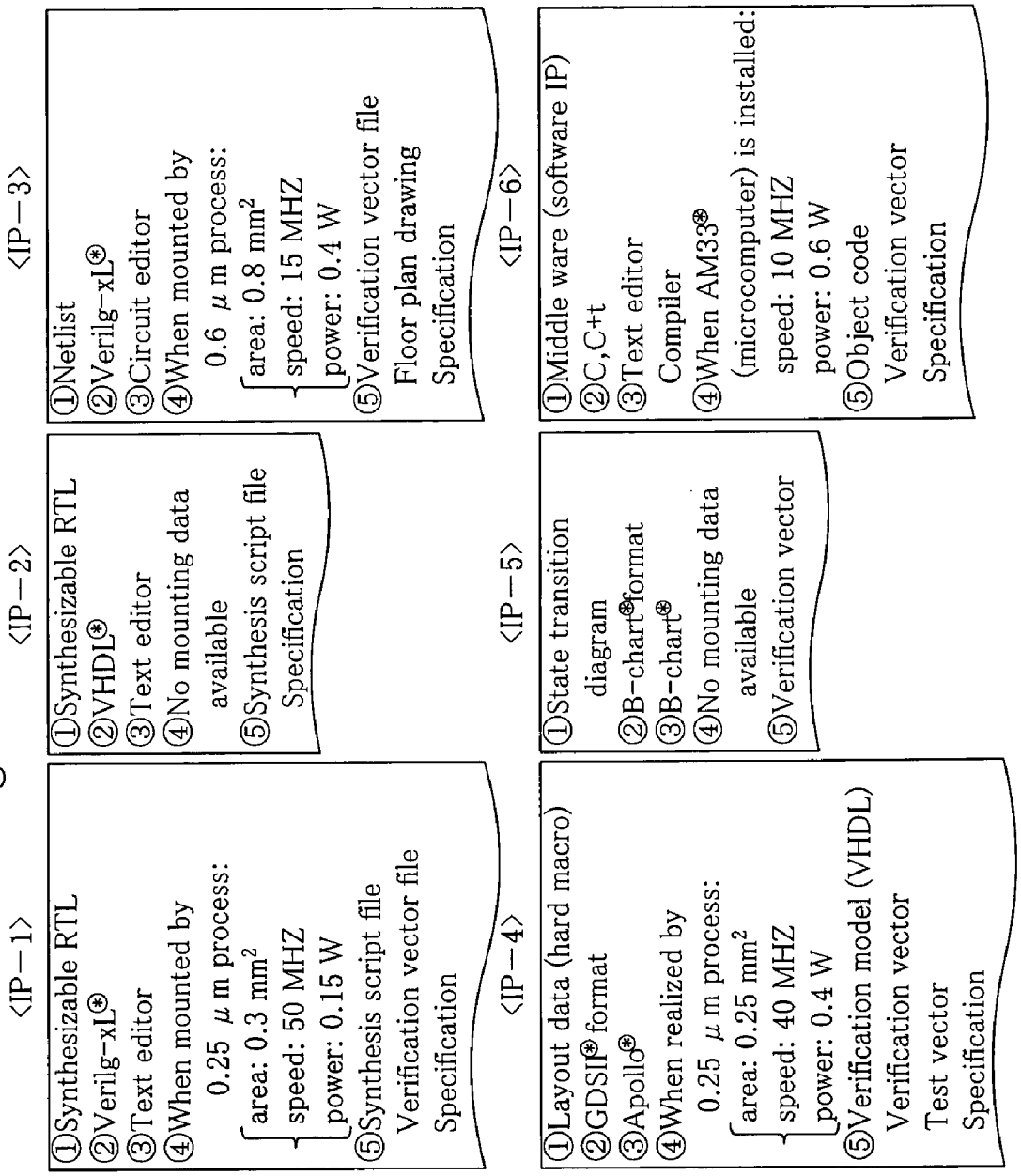
FIG. 14 is an example of IP information included in an existing design DB.

FIG. 14 is a diagram showing an example of IP information included in the existing design asset DB 82. In FIG. 14, data form, data display format, design method, design results and distributable objects for each of the IPs are described as the IP information.

FIG. 15 is a diagram showing an example of contents of the inter design assets compatibility evaluation rule DB 83. As shown in FIG. 15, the inter design assets compatibility evaluation rule DB 83 stores information for defining mutual compatibility between the IPs stored in the existing design asset DB 82 as shown in FIG. 14. Rules for defining compatibility include theoretical rules and empirical rules. Examples of the theoretical rules include "good consistency" and "prolongs the lifetime" for good compatibility, and "additional functions are required" and "specifications are not compatible" for poor compatibility. On the other hand, examples of the empirical rules include "many parts can be shared" and "consumption power can be reduced" for good compatibility, and "operation can not be verified" and "increases the area" for poor compatibility.

In the relevant design asset retrieval step S25, an IP having a similar function to that of a functional element for which no adequate IP was found is selected from the IPs stored in the existing design asset DB 82. Then, the function of the selected IP is revised so that it becomes suitable for the functional element. Thereby, man-hours required for the functional revision can be considerably reduced.

The revised IP is registered in the existing design asset DB 82 as a newly generated IP. Moreover, the existing design asset DB 82 may be provided with a means for managing history information such as a progenitor IP and differences from the progenitor IP regarding each of the IPs to be stored.

Third Embodiment

Figure 16:
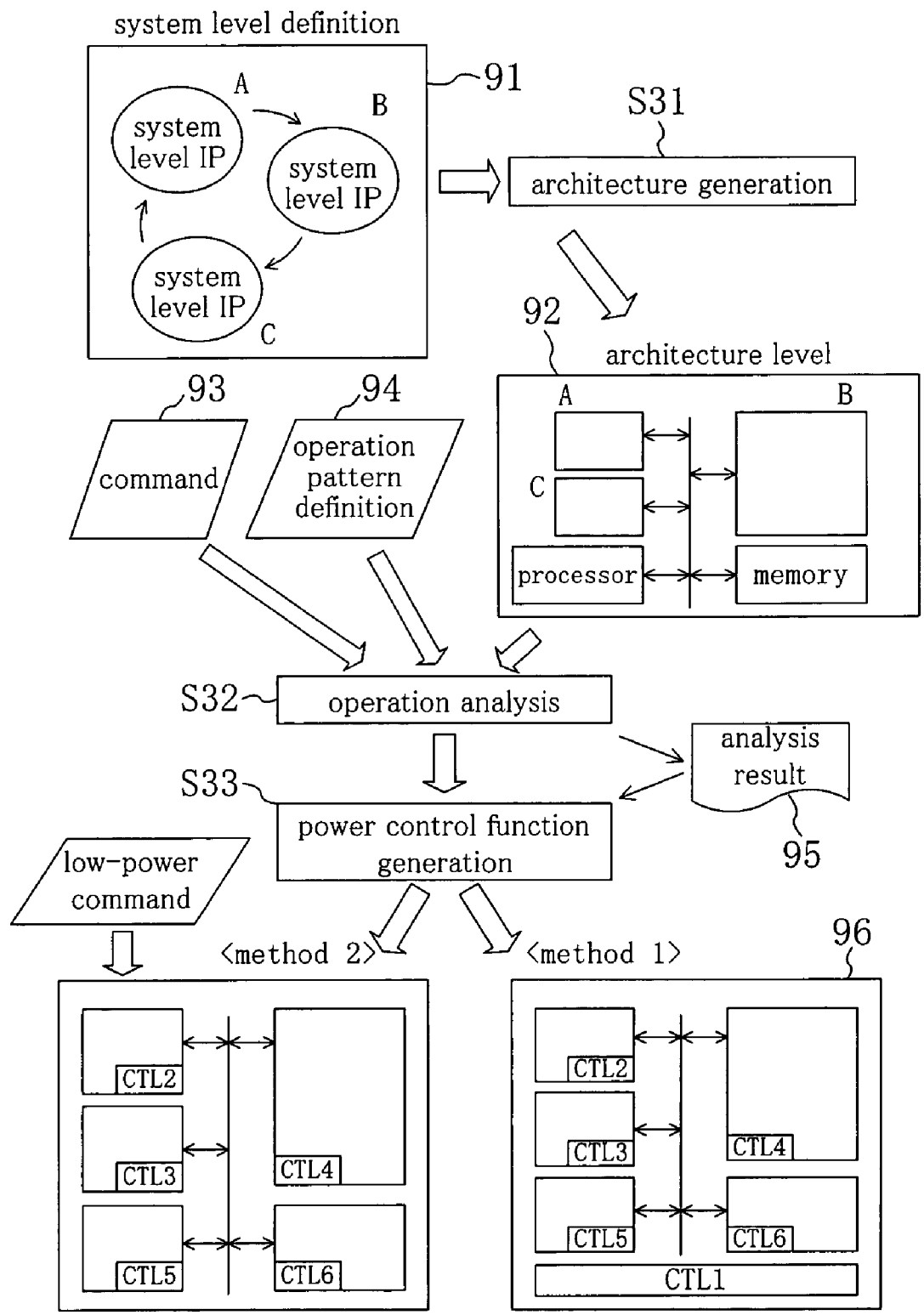
FIG. 16 is a diagram showing a configuration of an IP-based LSI design system according to the third embodiment of the present invention.

FIG. 16 is a diagram illustrating the configuration of an IP-based LSI design system according to the third embodiment of the present invention. In this embodiment, a low-power system LSI (with reduced power consumption) can be realized by utilizing IPs efficiently in the top-down design of the system LSI.

First, in the system level design, a function definition 91 according to a system level IP is obtained with respect to the LSI to be designed. Next, in an architecture generation step S31, design data 92 of the architecture level are generated from the function definition 91 according to the system level IP. Then, in an operation analysis step S32, operation analysis of the LSI to be designed is carried out using these design data 92 of the architecture level, a command 93 and an operation pattern definition 94 that defines the operation of the system LSI.

FIG. 17 is a diagram showing an example of the operation analysis results. In FIG. 17, it is necessary to supply power during operation, but it is unnecessary to supply power outside of operation so that in this case it is possible to turn the power off. Alternatively, a method of interrupting clock supply instead of turning the power off is also conceivable.

Then, in a power control function generation step S33, a power control block CTL1 for the entire LSI and power control blocks CTL2 to CTL6 for respective IPs are generated in the design data of the architecture level based on the operation analysis results 95 (method 1). Alternatively, power control may be performed by adding a low-power command to the original command instead of generating the power control block CTL1 for the entire LSI.

According to the present invention as described above, a data conversion circuit for communications can be generated easily, because each of the IPs in a system level IP is described divided into a processing algorithm description portion, an input data structure definition portion and an output data structure definition portion. Moreover, reuse efficiency of the IPs can be increased, because a function classification database, in which an equipment configuration is classified into respective elements with regard to function and arranged systematically, is used. Furthermore, power control blocks can be generated easily. Consequently, the design efficiency of IP-based LSI design can be further improved.

What is claimed is:

1. An IP-based LSI design system comprising a database having a hierarchical system level IP, behavior level IP and register transfer level IP used in system level design, architecture design and functional design,
   wherein, in said system level design, each hierarchical system level IP comprises:
   a processing algorithm description element describing a processing algorithm of said system level IP; and
   an interface definition element for transferring a data format from a communication channel and for receiving the transferred data format from said communication channel,
   wherein the interface definition element analyzes or verifies the consistency of input and output of said database.

2. The IP-based LSI design system according to claim 1, further comprising a conversion circuit generating element for generating a conversion circuit that converts data for communication between said communication channel and each of said system level IP, when said communication channel is provided between each of said hierarchical system level IP performing data communication in system level design, architecture design or function design.

3. The IP-based LSI design system according to claim 2, wherein, when said communication channel is provided between a first system level IP and a second system level IP communicating with each other, said conversion circuit generating element searches said database, reads out descriptions of said interface definition element comprising an output data structure definition portion of said first system level IP and an input data structure definition portion of said second system level IP, and generates said conversion circuit based on said read out descriptions.

4. The IP-based LSI design system according to claim 3, wherein said database further comprises a hierarchical system level IP for said communication channel; and
   wherein, when said communication channel is provided between said first system level IP and said second system level IP, said conversion circuit generating element searches said database and further reads out said input data structure definition portion or output data structure definition portion of said hierarchical system level IP for said communication channel.

5. The IP-based LSI design system according to claim 3, wherein, when said input data structure definition portion and said output data structure definition portion are different between said first system level IP and said second system level IP, said conversion circuit generating element generates said conversion circuit in accordance with information representing a correspondence between said input data structure definition portion and said output data structure definition portion.

6. The IP-based LSI design system according to claim 2, wherein the conversion circuit converts the amount of data per communication unit.

7. The IP-based LSI design system according to claim 2, wherein the conversion circuit performs a conversion between address data indicating a data area and actual data corresponding to the address data.

8. The IP-based LSI design system according to claim 1, wherein a function of system level IP overlaps a function of behavior level IP.

9. An IP-based LSI design method, using a database having a hierarchical system level IP, behavior level IP and register transfer level IP used in system level design, architecture design and functional design,
wherein, in said system level design, each hierarchical system level IP comprises:
describing a processing algorithm of said system level IP; and
transferring a data format from a communication channel and receiving the transferred data format from said communication channel,
wherein said design method analyzes or verifies the consistency of input and output of said database.

10. The IP-based LSI design method according to claim 9, comprising a step of generating a conversion circuit that converts data for communication between said communication channel and each of said system level IP, when said communication channel is provided between each of said hierarchical system level IP performing data communication in said system level design, architecture design or function design.

11. The IP-based LSI design method according to claim 10,
wherein, when said communication channel is provided between a first system level IP and a second system level IP communicating with each other, in said conversion circuit generating step, said database is searched, descriptions of said interface definition element comprising an output data structure definition portion of said first system level IP and an input data structure definition portion of said second system level IP are read out, and said conversion circuit is generated based on said read out descriptions.

12. The IP-based LSI design method according to claim 11, wherein said database further comprises a hierarchical system level IP for said communication channel; and
wherein, when said communication channel is provided between said first system level IP and said second system level IP, in said conversion circuit generating step, said database is searched and said input data structure definition portion or output data structure definition portion of said hierarchical system level IP for said communication channel are further read out.

13. The IP-based LSI design method according to claim 11,
wherein, when said input data structure definition portion and said output data structure definition portion are different between said first system level IP and said second system level IP, in said conversion circuit generating step, said conversion circuit is generated in accordance with information representing a correspondence between said input data structure definition portion and said output data structure definition portion.

14. The IP-based LSI design method according to claim 10,
wherein the conversion circuit converts the amount of data per communication unit.

15. The IP-based LSI design method according to claim 10,
wherein the conversion circuit performs a conversion between address data indicating a data area and actual data corresponding to the address data.

* * * * *